(12) United States Patent
Fisher

(10) Patent No.: US 6,279,402 B1
(45) Date of Patent: Aug. 28, 2001

(54) DEVICE FOR MEASURING PRESSURE IN A CHAMBER

(75) Inventor: Paul Fisher, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/566,353

(22) Filed: May 4, 2000

Related U.S. Application Data

(63) Continuation of application No. 09/131,535, filed on Aug. 10, 1998, now abandoned.

(51) Int. Cl.[7] ................ G01L 9/00; G01L 9/16
(52) U.S. Cl. ........................................ 73/754
(58) Field of Search ............... 73/714, 715, 716, 73/717, 719, 720, 721, 722, 723, 725, 726, 727; 216/2, 33; 430/313, 314; 29/25.42, 621.1; 128/675; 156/631.1, 633.1, 647.1, 657.1, 662.1

(56) References Cited

U.S. PATENT DOCUMENTS

| | | | |
|---|---|---|---|
| 4,790,192 | 12/1988 | Knetch et al. ............... | 73/721 |
| 5,097,841 | 3/1992 | Moriuchi et al. ............. | 128/675 |
| 5,576,147 | 11/1996 | Guckel et al. ................ | 430/313 |
| 5,702,619 | 12/1997 | Kurtz et al. .................. | 216/2 |
| 5,706,565 | 1/1998 | Spark et al. .................. | 29/25.42 |

OTHER PUBLICATIONS

Data Sheet: Advanced Custom Sensors, Model 7000, May 27, 1998.
Data Sheet: Entran Pressure Sensors, EPI Subminiture Pressure Sensors, May 27, 1998.

*Primary Examiner*—William Oen
(74) *Attorney, Agent, or Firm*—Townsend and Townsend and Crew

(57) ABSTRACT

A device for measuring pressure at several locations in a processing chamber under dynamic conditions, i.e. when gas is flowing into and/or out of the chamber. A substrate has a plurality of pressure sensors electrically coupled to a measurement instrument. Conditions are established within a processing chamber to determine the effects of various process parameters, such as gas flow, on local pressures, and the local pressures are measured. The test conditions may simulate a process or may be standard test conditions to evaluate chamber configurations or hardware. The pressure test substrate may be calibrated under static conditions to improve the accuracy of the pressure readings.

53 Claims, 10 Drawing Sheets

DEVICE FOR MEASURING PRESSURE IN A CHAMBER

This is a continuation patent application of patent application Ser. No. 09/131,535, filed: Aug. 10, 1998 now abandoned.

BACKGROUND OF THE INVENTION

The present invention relates to electronic devices, and more particularly to a pressure test wafer capable of measuring the pressure at several points on the pressure test wafer inside a chamber while gas is flowing into and/or out of the chamber.

Chambers are used in many types of processing systems. Examples of such processes include chemical vapor deposition (CVD) processes, such as plasma-enhanced CVD (PECVD) processes, and dry etch processes, among others. Typically, a substrate, such as a semiconductor wafer, is placed in the vacuum chamber and conditions in the chamber are set and maintained to process the substrate in a desired fashion. Generally, it is desirable to minimize the processing differences, such as the thickness of a deposited layer or the depth of an etch, across the wafer.

Minimizing the process differences across a wafer depends on controlling the parameters that affect the process, such as wafer surface temperature, gas flow rates, and chamber pressure. Variations in processing parameters across the wafer can result in nonuniform processing.

Often, variations in a processing parameter are inferred by evaluating trial wafers that have been processed under various conditions rather than by measuring the parameter directly. For example, the thickness of a CVD layer may be measured at several points across each wafer in a series of wafers processed at different nominal chamber pressures to evaluate the effect of pressure on the thickness of the layer. The nominal chamber pressure is typically measured by a pressure gauge at a single point of the chamber. However, the nominal chamber pressure does not necessarily indicate either the actual pressure at the surface of the wafer or the local pressure variations that can occur across the surface of a wafer arising from the dynamic effects of the gas flow.

Additionally, conventional methods for evaluating process parameters by using a series of trial wafers can be time-consuming, expensive, inaccurate, and provide limited data. The methods are time-consuming because typically several wafers must first be processed, and subsequently evaluated. The methods are expensive because they consume both trial wafers and the cost of repeated process runs that could otherwise be devoted to production. The methods are inaccurate and provide limited data because the measurement is a secondary measurement (e.g., of film thickness) rather than a direct measurement, of the local pressure for example, and because the observed change may not have been caused by a variation in the test parameter.

Therefore, it is desirable to provide a device and a method for directly measuring the pressures at and across the surface of a wafer in a processing chamber under dynamic gas flow conditions.

SUMMARY OF THE INVENTION

The present invention provides a device and a method for measuring the pressure across the surface of a test wafer during simulated processing conditions. The simulated process may be, for example, a CVD process or an etch process. In an exemplary embodiment, a plurality of micro-electromechanical systems (MEMS) pressure sensors are arranged across the surface of a test wafer. The pressure sensors are attached to wires that lead outside of a processing chamber. Electrical signals from the pressure sensors are measured under simulated wafer processing conditions to determine the pressure at the various pressure sensors. Processing parameters, such as nominal chamber pressure, gas flow rates, exhaust rates, and wafer position may be varied to determine the effect these parameters have on the pressure present at the surface of the wafer.

In another embodiment, the MEMS pressure sensors are fabricated in a test substrate, and conductive interconnects bring the electrical signals from the pressure sensors to the edge of the substrate. In a further embodiment, the MEMS and the interconnects are fabricated to withstand higher processing temperatures and incorporate high-temperature metallization layers. In another embodiment, the MEMS pressure sensors are optimized to provide greater sensitivity within an expected pressure range.

The present invention also provides an assembly for measuring pressure on a substrate comprising a reactor chamber for processing semiconductor wafers; a substrate disposed in the reactor chamber; and a gas flowing into and out of the reactor chamber for assisting in producing a pressure on the substrate. At least one pressure sensor is disposed on surface of the substrate to provide at least one electrical signal in response to the pressure on the substrate.

The present invention further provides a device for measuring pressure in a chamber comprising a substrate having a substrate surface and including a structure defining a cavity. A chip pressure sensor is disposed in the cavity; and at least one conductive trace is disposed on the substrate surface and is electrically coupled to the chip pressure sensor.

The present invention also further provides an integrated test wafer for measuring pressure in a processing chamber comprising a silicon substrate having a substrate surface and including a substrate structure with no flexible diaphragm. A plurality of pressure sensors is integrally formed in the substrate and in proximity to the substrate surface such as to be exposed for measuring pressure in a reactor chamber; and a conductive trace is disposed on the substrate surface.

The present invention yet further provides a device for measuring pressure in a chamber comprising a substrate having a substrate surface and a structure defining a cavity; a first diaphragm layer supported by the substrate layer and extending over the cavity; and a second diaphragm layer supported by the first diaphragm layer. At least one thin-film resistor is supported by the second diaphragm layer; and at least one conductive trace is supported by the substrate surface and is coupled to the at least one thin-film resistor.

These and other embodiments of the present invention, as well as some of its advantages and features, are described in more detail in conjunction with the text below and attached figures.

DESCRIPTION OF PREFERRED EMBODIMENTS

When substrates, such as semiconductor wafers, are processed in a processing chamber, the nominal chamber pressure may not accurately reflect the local pressure at the surface of the wafer. Specifically, the pressure on the surface of a wafer directly across from a gas inlet or nozzle can be greater than the nominal chamber pressure, which is often measured at a chamber location removed from the wafer. Some processes, such as CVD or etch processes, are sensitive to variations in the pressure. If the result of a process is not uniform across a wafer, increased yield loss of chips from the wafer may result. The importance of uniform processing has increased as device geometry has become smaller and also as the size of the substrate has become larger.

A method has been developed for directly measuring the localized pressure across a substrate during simulated process conditions. The method uses a test wafer with an array of pressure sensors on the surface of the test wafer. The sensors provide an electrical signal that indicates the pressure. The electrical signal is brought out of the processing chamber in thin wires that are attached to the wafer. The wires are thin enough to fit between a chamber seal. The test wafer with the pressure sensor array provides a real-time indication of the pressure at several points of the wafer.

Figure 1:
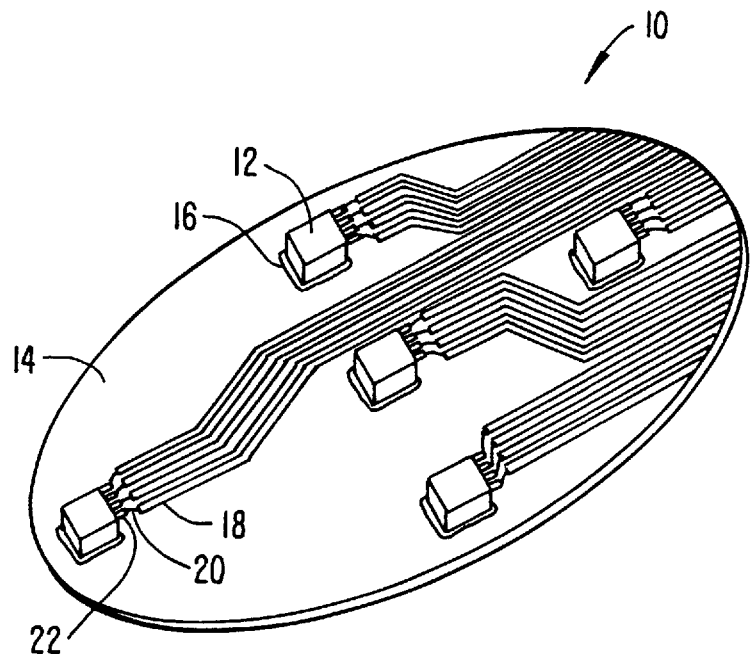
FIG. 1 is a simplified view of a pressure test wafer with packaged pressure sensors.

FIG. 1 is a simplified representation of a test wafer 10 according to one embodiment of the present invention. The test wafer 10 could be a silicon wafer, or could be made of glass, ceramic, printed circuit board material, or other material. A number of pressure sensors 12 have been attached to a surface 14 of the wafer with epoxy adhesive 16. The sensors could be attached to the wafer using other adhesives, such as silicone or urethane adhesives. The sensors could be a variety of sensors, such as capacitive MEMS pressure sensors, piezoresistive MEMS pressure sensors, or other types of pressure sensors, and could be a combination of types of pressure sensors. The pressure sensors are absolute pressure sensors, which typically have a reference pressure sealed on one side of a diaphragm, but may be gauge-type of other pressure sensors.

The sensors 12 are electrically connected to traces 18 on the wafer. Interconnect wires 20 are soldered to lead frame pins 22 on the sensors 12 and the traces 18. The traces may be adhesive metal foil, for example, or may be formed on the wafer using conventional photolithographic techniques. The sensors 12 are packaged pressure sensors, such as the Model 7000-1 sold by ADVANCED CUSTOM SENSORS, INC., the Model EPI-411 sold by ENTRAN®, SENSEON™ pressure sensors sold by MOTOROLA, or similar sensors. Packaged sensors are useful for a variety of applications, but are typically limited in operating temperature to less than about 150° C. because of packaging material constraints and other considerations.

Figure 2A:
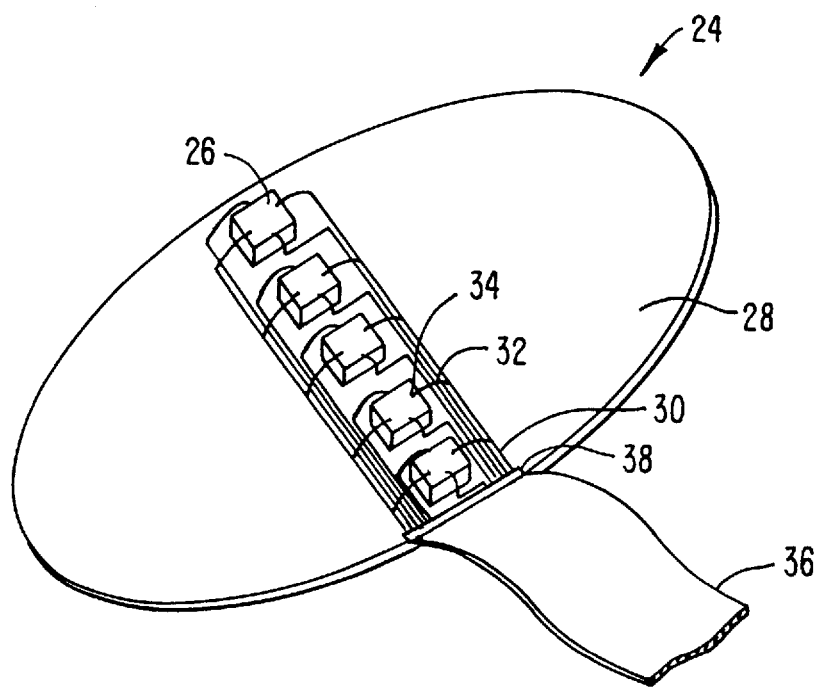
FIG. 2A is a simplified view of a pressure test wafer with pressure sensor die attached to the surface of the wafer.

FIG. 2A is a simplified representation of a test wafer 24 with several "chip" or "die" sensors 26 bonded to a substrate 28, which in this case is an 8"200mm silicon wafer. The wafer could be smaller, such as a 150 mm wafer, or larger, such as a 300 mm or larger wafer. The die are bonded to the substrate with a suitable adhesive, such as RTV 730™ silicone adhesive manufactured by the DOW CORNING CORPORATION or PYRO-PUTTY™ high-temperature epoxy manufactured by AREMCO. Traces 30 have been formed on the substrate 28 by depositing and patterning a first metal layer, such as a 10% titanium-90% tungsten layer (TiW), which has relatively good adhesion and forms a good barrier layer, and then plating the patterned metal layer with a good conductor, such as gold or copper, or depositing and patterning a layer of aluminum. Wire bonds 32 electrically connect contact pads 34 on the chip sensors 26 to the traces 30. Alternatively, the traces could be formed using printed circuit board techniques, or thick-film techniques, and the substrate could be made of other material, such as glass, ceramic, or printed circuit board material.

For piezoresistive-type pressure sensors, which often use a Wheatstone bridge circuit patterned on a diaphragm, there are typically four contacts per sensor: a source voltage ($V_s$), a first signal voltage (S+), a second signal voltage (S−), and a ground connection. The ground and source voltage can be common to all of the sensors, so that the total number of wires in a ribbon connector 36 is twice the number of sensor chips plus two. The wires, which may actually be flat strips, are soldered or welded to the traces and are insulated from each other. In one case, they are metallized traces sandwiched between polyimide films. Polyimide film can be used at temperatures up to about 250° C. Other types of insulation, such as quartz tubing or woven fiber-glass, may be used at higher temperatures. Strain relief 38 is provided by a strip of silicone adhesive or polyimide tape.

The use of chip devices improves at least two aspects of the test wafer 20 compared with a test wafer using packaged sensors. First, the chip sensors have less effect on the flow of gas across the surface of the wafer, and hence cause less disruption of the local pressures across the surface of the wafer. This effect is further reduced by the wire bonds, which generally disrupt the flow less than larger, soldered wires. Second, chip sensors are not limited to the operating temperature range of packaged sensors arising from the limitations of the packaging material. However, the chip sensors are still typically limited to operating temperatures of less than about 450° C. because they commonly include aluminum metallization layers, which are usually unreliable at temperatures exceeding about 450° C.

Figure 2B:
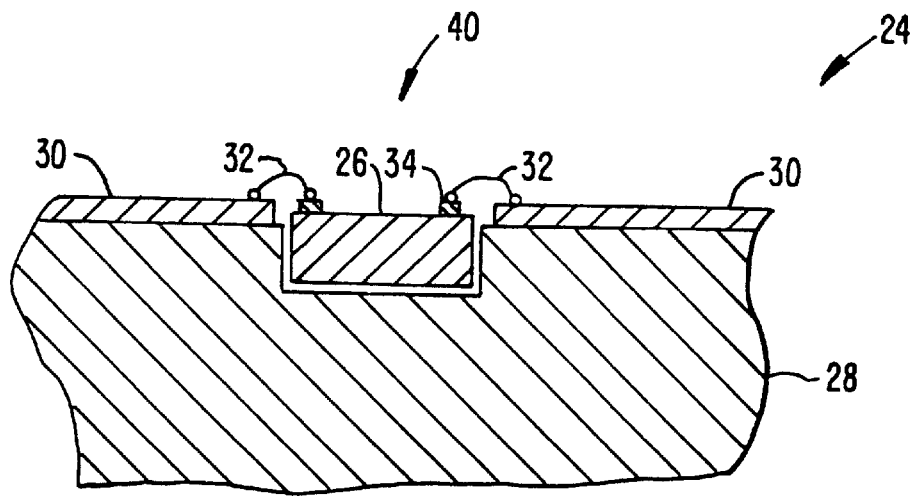
FIG. 2B is a simplified cross-section of a portion of a pressure test wafer with a recessed pressure sensor die.

FIG. 2B is a simplified cross-section of a test wafer 24 with pockets, or receptacles, 40 formed in a substrate 28. The receptacles 40 contain chip pressure sensors 26, which are connected to traces 30 on the surface of the substrate with wire bonds 32. Providing the receptacles further reduces the effect the pressure sensors may have on the flow of gas across the surface of the wafer. The receptacles are formed using an anisotropic dry etching technique, such as a reactive ion-etching technique, in the case where the substrate is a silicon wafer, but may be machined or otherwise formed if the substrate is made of printed circuit board material, for example.

Figure 3:
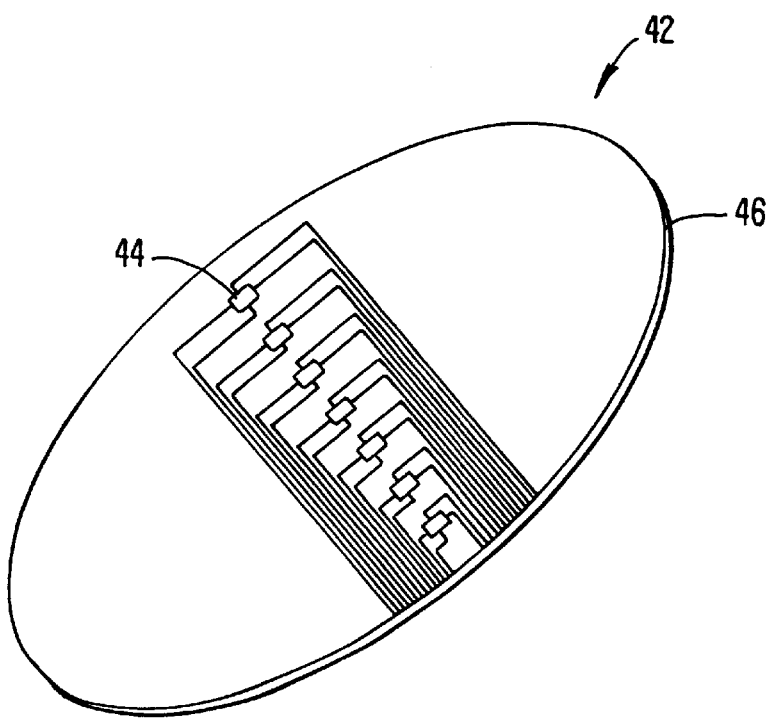
FIG. 3 is a simplified view of a pressure test wafer with integrated pressure sensors.

FIG. 3 is a simplified representation of a test wafer 42 with integrated sensors 44. The sensors are formed in a silicon wafer 46, such as a 200-mm or 300-mm silicon wafer. The silicon wafer used to fabricate the test wafer may have a higher defect density than a silicon wafer that would be used for integrated circuit device fabrication that included active devices, such as transistors, and may even be a polysilicon wafer. For example, the defect density of a silicon wafer used to fabricate a test wafer may have a defect density greater than about $0.15/cm^2 > 0.2\mu$.

The sensors were fabricated with "high-temperature" metallization layers. For the purposes of this application, a "high-temperature" metallization layer is a metallization layer that is reliable at temperatures greater than 450° C. when used in conjunction with a silicon substrate. Such metallization layers include, but are not limited to, tungsten, titanium, titanium-tungsten, molybdenum, gold, copper, polysilicon, amorphous silicon, silicides, and various combinations of different metallization layers. As the test wafer 30 does not contain active devices, a wider variety of metals may be used than might typically be used with integrated circuits that include active devices. However, if a single-rystal silicon wafer is used, test wafers may be fabricated with integrated, associated circuitry containing active devices. Such circuitry may balance, amplify, buffer, or thermally compensate the signals from the pressure sensors.

Figure 4:
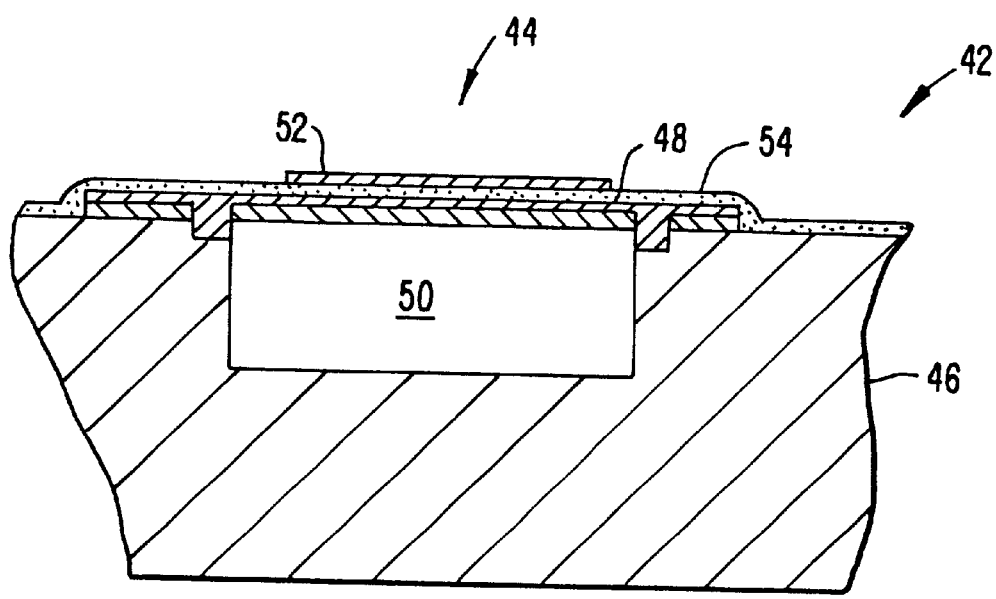
FIG. 4 is a simplified cross-section of an integrated pressure sensor.

FIG. 4 shows a simplified cross-section of a portion of a test wafer that includes an integrated pressure sensor 44 fabricated in a silicon substrate 46. The integrated pressure sensor was formed using conventional semiconductor fabrication methods that are compatible with other integrated circuits, such as transistor circuits. A polysilicon diaphragm 48 is formed over a chamber 50 left behind after removing a sacrificial layer between the diaphragm 48 and the silicon substrate, and filling the holes that were used in the removal of the sacrificial layer. Thin-film sense resistors 52 are formed by patterning a layer of resistive metal, such as tungsten or molybdenum, that is deposited using CVD or sputtering techniques, over an optional dielectric layer 54 on the polysilicon diaphragm.

The thin film resistors may be trimmed, if necessary. One way to trim a resistor is by use of a local oxidation process. In a local oxidation process, the resistance of one leg of the resistor bridge is monitored as that leg is locally heated by means of a laser or Joule heating in an oxygen environment. Joule heating may be performed by flowing sufficient electric current through the resistor leg to heat only that leg. Some of the thin-film metal is oxidized, thus increasing the resistance of that leg. When the desired resistance value is obtained, the resistor is blanketed with an inert gas, such as nitrogen, and the application of local heat is stopped. Alternatively, laser trimming may be used to reduce the width, and hence increase the resistance, of a portion of the leg of the resistor bridge.

Figure 5A:
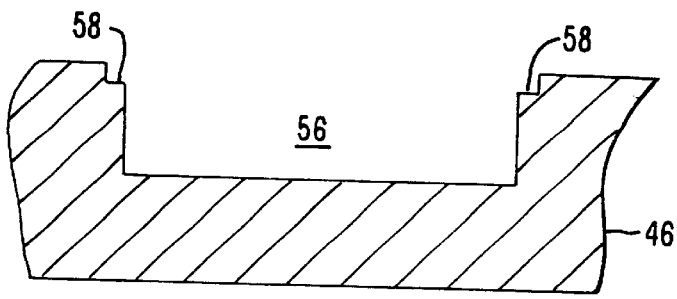
FIGS. 5A–5F are simplified cross-sections of a portion of a pressure test wafer illustrating fabrication of an integrated pressure sensor.

FIGS. 5A–5F show simplified sections of portions of a pressure sensor being formed in a substrate 46. FIG. 5A shows a cavity 56 formed in the substrate using an anisotropic etch technique, such as a reactive ion etch (RIE) technique. The cavity 56 is formed using a two-step etch process to form ledges 58 around at least a portion of the perimeter of the cavity. The square cavity is about 0.4 mm deep and about 0.2 mm on a side, although other shapes and dimensions could be used.

Figure 5B:
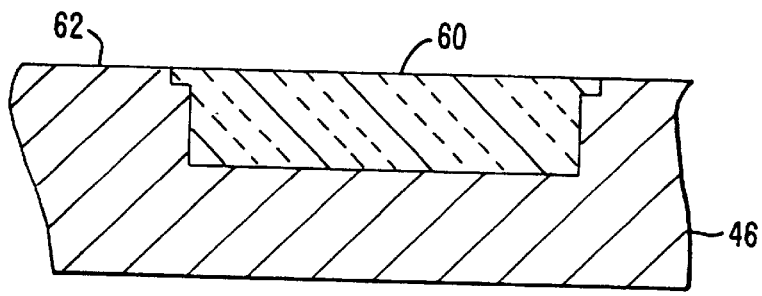

FIG. 5B shows the cavity filled with a sacrificial material 60, such as phosphorous-silicon glass (PSG). The PSG may be deposited or spun onto the cavity. The sacrificial material is chosen to have a high etch selectivity relative to substrate and/or diaphragm material, which are both silicon in this instance. For example, buffered hydrofluoric acid (BHF) readily dissolves PSG while not appreciably dissolving silicon, hence BHF has a high etch selectivity between PSG and silicon. Alternative sacrificial materials include organic materials, such as polyimide or polymethylmethacrylate, in which case an organic solvent, developer, or oxygen plasma may be used to release the sacrificial material. The sacrificial material is chosen to withstand the processing temperatures related to the first diaphragm deposition, as described below. The sacrificial material is deposited and then planarized so that the surface of the sacrificial material 60 is essentially level with the surface 62 of the substrate 46. Planarization may be achieved using a non-selective plasma etch, chemical-mechanical polishing (CMP) techniques, or other methods.

Figure 5C:
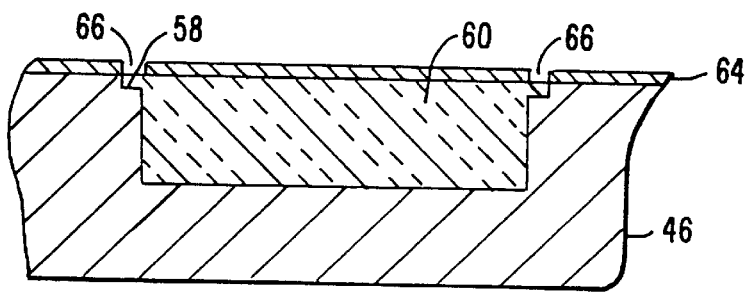
Figure 5D:
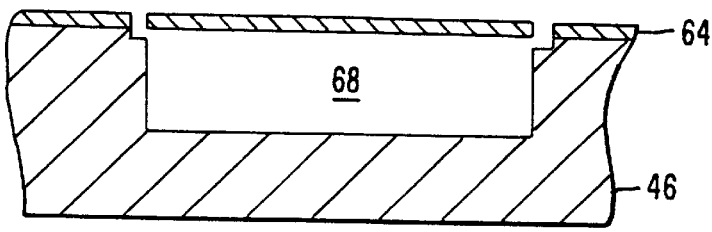

FIG. 5C shows a first polysilicon layer 64 deposited over the filled cavity. Release windows 66 are etched in the first polysilicon layer 64 above the ledges 58 to expose the sacrificial material 60. FIG. 5D shows the cavity 68 after the PSG is released using a BHF etchant.

Figure 5E:
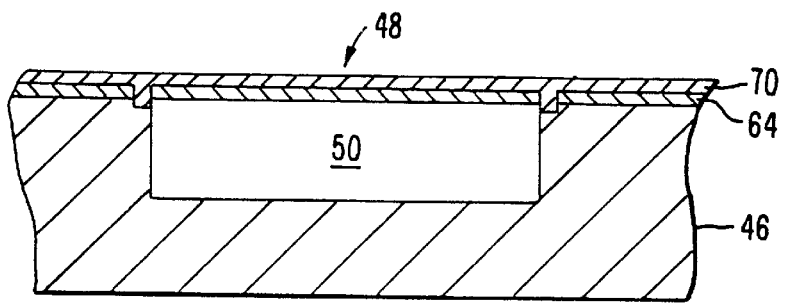

FIG. 5E shows the pressure sensor with a second layer of polysilicon 70 deposited over the first layer of polysilicon 64 to fill the release windows. The second layer of polysilicon is deposited in a conformal fashion to fill the release windows from the ledges up, thus trapping the ambient pressure present during the deposition of the second polysilicon layer inside the cavity to form a chamber 50. The first polysilicon layer 64 and second polysilicon layer 70 form a diaphragm 48 for the pressure sensor. It is understood that other materials, such as metals, may be used for the diaphragm alternatively or in addition to the polysilicon, and that the cavity pressure may be varied according to the process limits during the window-filling process. If a metal is chosen as the diaphragm material, an insulating layer (not shown) may be formed between the resistors and the diaphragm. The thickness of the diaphragm is chosen to be strong enough to withstand the contemplated operating pressures, which in one application is between ambient pressure (about 0 psig) and high vacuum (about −15 psig). It is generally desirable that the diaphragm is sufficiently flexible to be responsive to the anticipated changes in pressure. Alternatively, the diaphragm can be made of a single layer of material with the second layer filling the release windows without overlying the first layer. The second layer may be deposited and then partially removed using an etch or polishing process to leave the material of the second layer in the release windows but not over the diaphram.

Figure 5F:
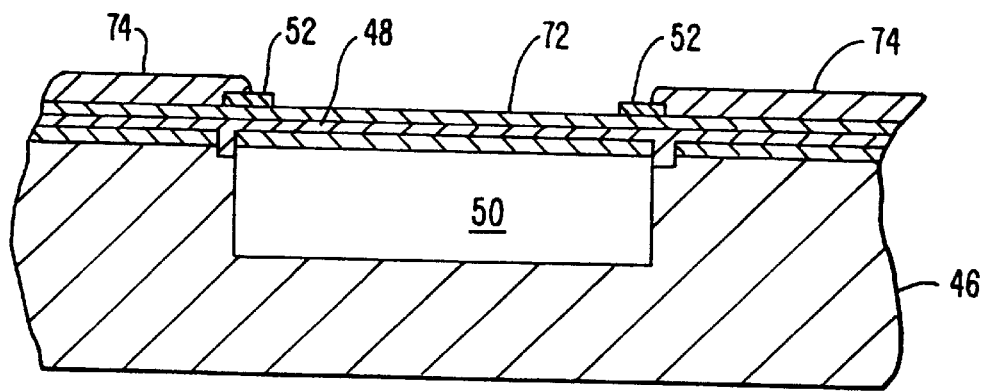
Figure 5G:
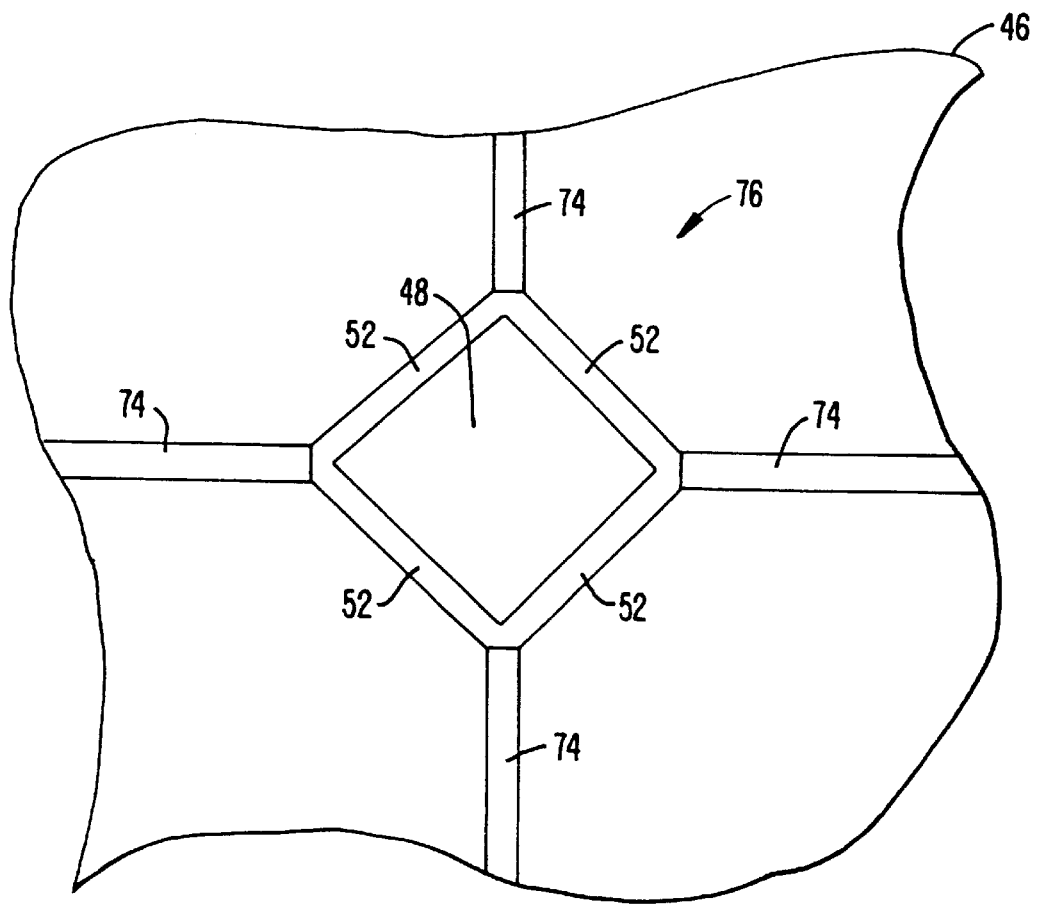
FIG. 5G is a simplified top view of a portion of a pressure test wafer with an integrated piezoresistive pressure sensor configured as a Wheatstone bridge.

FIG. 5F shows a section of a portion of a completed pressure sensor with the sealed chamber 50. The diaphragm 48 is planarized and an adhesion/barrier layer 72 of TiW is deposited and patterned beneath the resistors 52 and the traces 74. The resistors are thin-film tungsten resistors. The traces are plated with a high-temparature conductor, such as gold or copper, but may be deposited or otherwise formed. FIG. 5G is a top view of a pressure sensor showing four resistors 52 forming a Wheatstone bridge 76 on the diaphragm 48, and four traces 74 for $V_s$, S+, S−, and ground, as discussed above. The nominal output impedance is about 1000 Ω, and $V_s$ is between about 5–10V. It is understood that alternative piezoresistive structures or piezocapacitive structures may be used instead of, or in addition to, the piezoresistive structure described above.

Figure 6A:
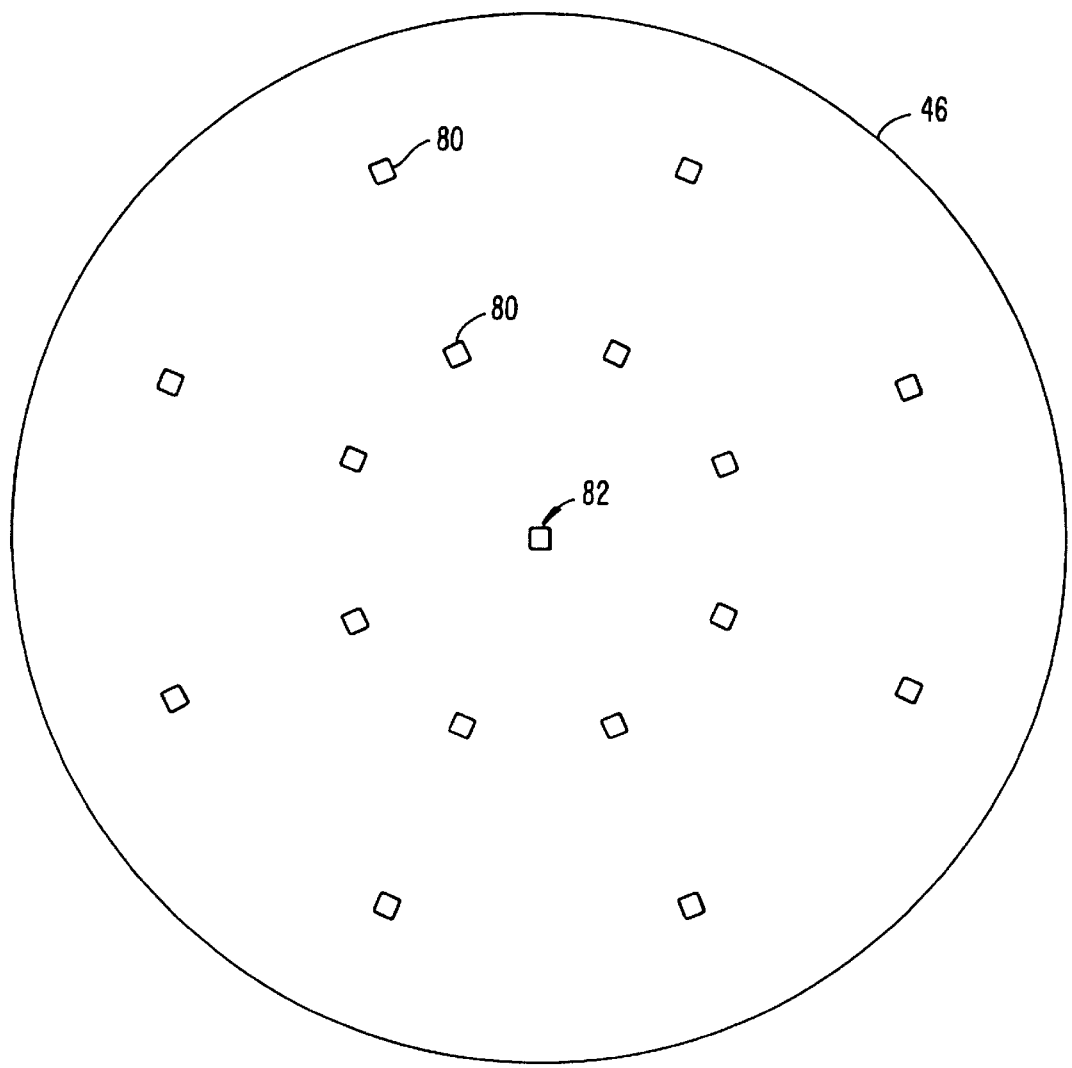
FIGS. 6A and 6B are simplified views of exemplary arrangements of pressure sensors on pressure test wafers.

FIG. 6A shows the approximate location of seventeen pressure sensors 80 arrayed on a substrate 46, which is a 200-mm silicon wafer. The locations of the pressure sensors correspond to the approximate location of thermocouples arrayed on a temperature test wafer, such as a PROCESSPROBE® 1530 sold by SENSE ARRAY CORPORATION of Santa Clara, Calif., allowing convenient correlation between pressure measurements and temperature measurements of a chamber. A pressure sensor is located approximately in the middle 82 of the substrate 46, and additional sensors are arrayed about every 45 degrees at a radius of about 44.45 mm and at a radius of about 88.9 mm.

Figure 6B:
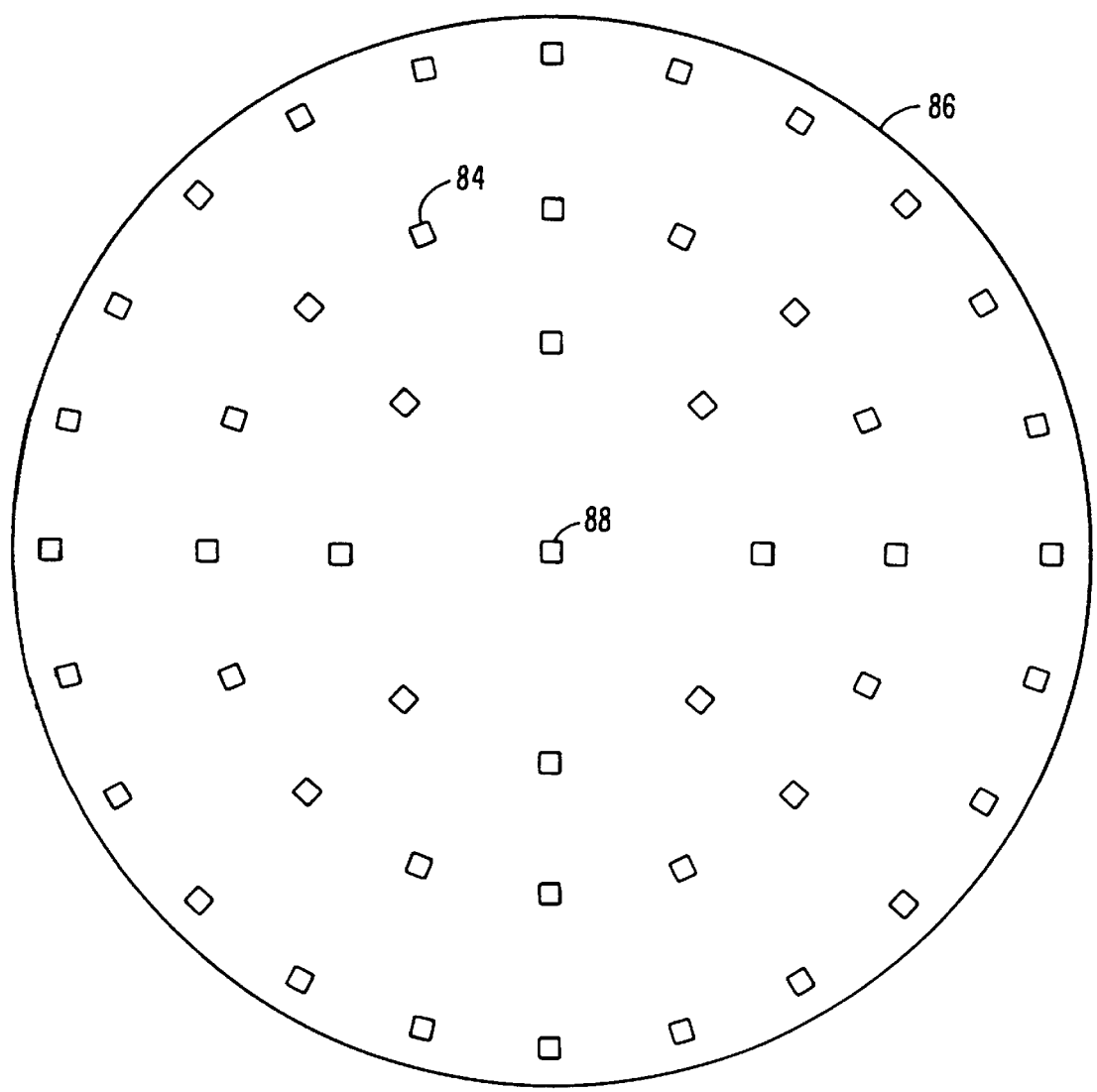

FIG. 6B shows the approximate location of forty nine pressure sensors 84 arrayed on a substrate 86 which is a 300-mm silicon wafer. These locations correspond to one configuration of thickness measurement points of a PROMET RIS tool, sold by KLA-TENCOR CORPORATION, of Milpitas, Calif., allowing convenient correlation to the measured localized pressure and measured thickness. The approximate locations of the sensors, in addition to a sensor at the center of the substrate, are given in Table 1, below:

TABLE 1

| Angle (deg.) | r = 32.33 mm | r = 64.66 mm | r = 97 mm |
|---|---|---|---|
| 0 | X | X | X |
| 15 | | | X |
| 22.5 | | X | |
| 30 | | | X |
| 45 | X | X | X |
| 60 | | | X |
| 67.5 | | X | |
| 75 | | | X |
| 90 | X | X | X |
| 105 | | | X |
| 112.5 | | X | |
| 120 | | | X |
| 135 | X | X | X |
| 150 | | | X |
| 157.5 | | X | |
| 165 | | | X |
| 180 | X | X | X |
| 195 | | | X |
| 202.5 | | X | |
| 210 | | | X |
| 225 | X | X | X |
| 240 | | | X |
| 247.5 | | X | |
| 255 | | | X |
| 270 | X | X | X |
| 285 | | | X |
| 292.5 | | X | |
| 300 | | | X |
| 315 | X | X | X |
| 330 | | | X |
| 337.5 | | X | |
| 345 | | | X |

Figure 7:
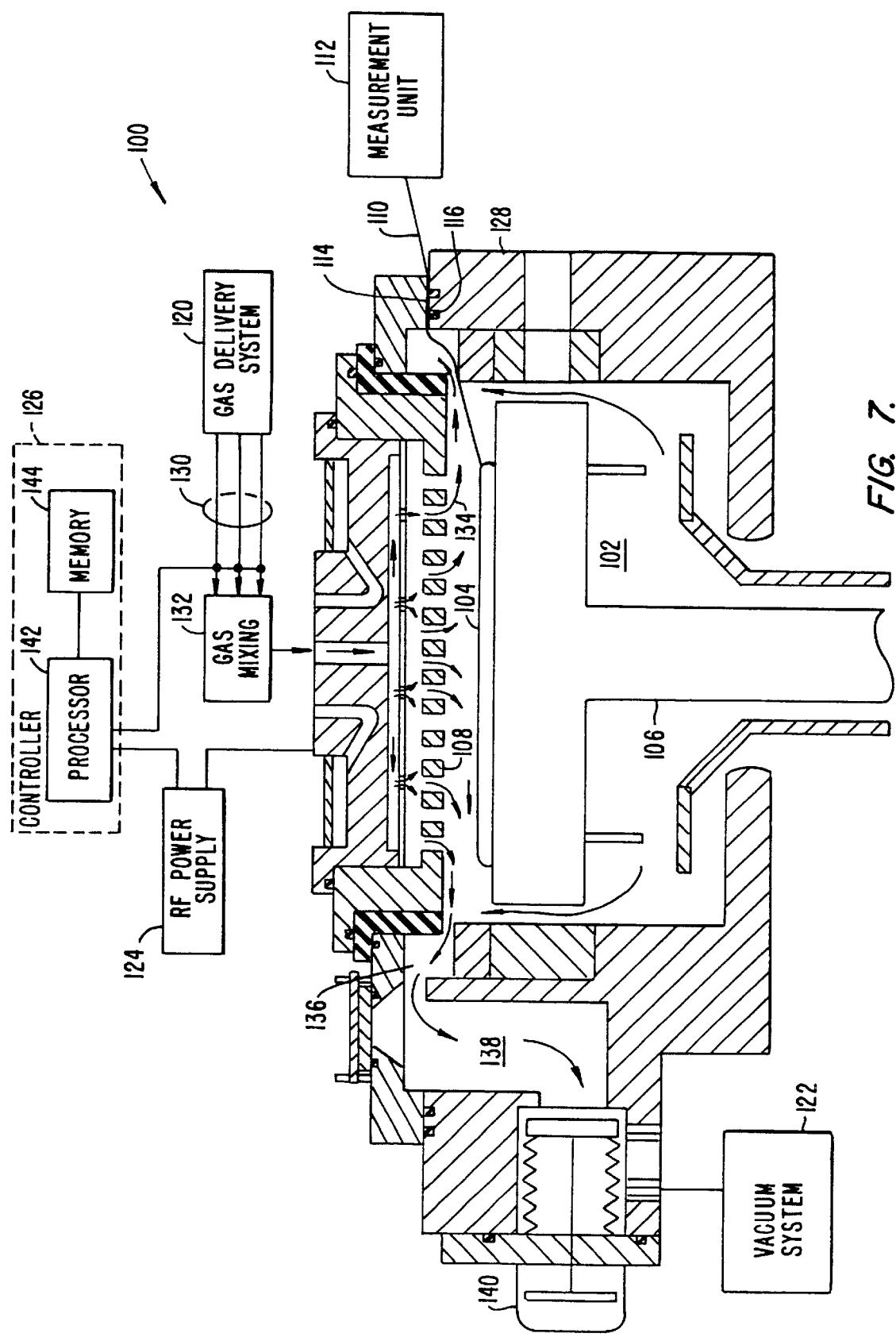
FIG. 7 is a simplified cross-section of a pressure test wafer in a chamber of a processing system.

FIG. 7 is a simplified cross-section of a processing system 100, including a chamber 102 with a pressure test wafer 104 inside the chamber. The pressure test wafer 104 is supported by a pedestal 106 beneath a gas inlet manifold 108, as a process wafer might be supported. A thin ribbon cable 110, connects the pressure test wafer, which has a plurality of pressure sensors on its surface, to a measurement unit 112 outside of the chamber. The thin ribbon cable 110 includes a plurality of conductors sealed between two sheets of polyimide film, and fits within the chamber seal 114, which includes compliant O-rings 116.

The measurement unit 112 includes a multiplexer, voltmeter, power supply, memory, measurement controller, and user input/output. A computer may provide the memory, measurement controller functions, and user input/output, and may control the voltmeter, multiplexer, and other functional blocks of the measurement unit. Alternatively, the measurement unit may be integrated as a single instrument. The memory may contain a calibration array for the pressure test wafer, or the pressure test wafer can be used in some applications without calibration. The power supply provides the operating current and voltage for the sensors on the wafer. The multiplexer switches the outputs from the various sensors to the voltmeter in a fashion selected by the user, typically through the controller.

The processing system is suitable for performing CVD processes, such as subatmospheric (SACVD) processes and PECVD processes, and etch processes. Multiple-step processes can also be performed on a single substrate or wafer without removing the substrate from the chamber. The major components of the system include, among others, a vacuum chamber 102 that receives process and other gases from a gas delivery system 120, a vacuum system 122, a plasma system 124, and a control system 126.

The processing system 100 includes an enclosure assembly 128 housing a vacuum chamber 102. The gas inlet manifold 108 is provided above the wafer 104 for dispersing reactive gases and other gases, such as purge gases, through perforated holes in the gas inlet manifold 108. The wafer rests on a vertically movable pedestal 106 that includes an integrated heater (not shown). The pedestal 106 can be moved controllably between a lower position and an upper position closely adjacent to the gas inlet manifold, or to other positions. A centerboard (not shown) includes sensors for providing information on the position of the wafer.

Gases are supplied through supply lines 130 into a gas mixing box (also called a gas mixing block) 132, where they are preferably mixed together and delivered to the gas inlet manifold 108. During deposition processing or chamber pressure testing, gas supplied to the gas inlet manifold is vented toward the wafer surface, as indicated by arrows 134.

Purging gas may be delivered into the vacuum chamber 102 from the inlet manifold and/or an inlet port or tube (not shown) through the bottom wall of enclosure assembly 128. The purging gas flows upward from the inlet port past the pedestal 106 and to an annular pumping channel 136. An exhaust system then exhausts the gas into the annular pumping channel 136 and through an exhaust line 138 to a vacuum system 122, which includes a vacuum pump (not shown). Exhaust gases and entrained particles are drawn from the annular pumping channel 136 through the exhaust line 138 at a rate controlled by a throttle valve system 140.

The system controller 126 controls activities and operating parameters of the deposition system. The processor 142 executes system control software, such as a computer program stored in a memory 144 coupled to the processor 142. Preferably, the memory 144 is a hard disk drive, but the memory 144 may be other kinds of memory, such as read-only memory or flash memory. In addition to a hard disk drive (e.g., memory 144), the CVD apparatus 100 in a preferred embodiment includes a floppy disk drive and a card rack (not shown).

The processor 142 operates according to system control software, which includes sets of instructions that dictate the timing, mixture of gases, chamber pressure, chamber temperature, microwave power levels, pedestal position, and other parameters of a particular process. Other computer programs such as those stored on other memory, for example, a floppy disk or other computer program product inserted in a disk drive or other input device, may also be used to operate the processor 142 to configure the CVD system 100 into various apparatus.

The processor 142 has a card rack (not shown) that contains a single-board computer, analog and digital input-loutput boards, interface boards and stepper motor controller boards. Various parts of the CVD system 100 conform to the Versa Modular European (VME) standard that defines board, card cage, and connector dimensions and types. The VME standard also defines the bus structure having a 16-bit data bus and 24-bit address bus.

Measuring dynamic local pressures in the chamber preferably includes a calibration step. The calibration step establishes what the signals from each pressure sensor are at various pressures. A static pressure is established within the chamber, and the output signals from each of the pressure sensors are measured with a voltmeter, such as a differential voltmeter, and stored as an array in a digital memory. Outputs from the various pressure sensors are multiplexed to the voltmeter. Additional static pressures are established and the output signals from each pressure sensor are again measured and stored. In this fashion a calibration array is created for all of the pressure sensors on the test wafer for at least two pressures.

The pressure test wafer is used for at least two purposes. The first is to characterize the local dynamic pressures in a processing chamber as different parameters, such as pedestal height, gas flow rate, and exhaust rate, are varied, or to test new processing system hardware for research and development purposes. The second is to characterize the local dynamic pressures in a processing chamber during a simulated process. In one application, the output signals of a sensor during a pressure test are compared against the calibration data for that sensor A calibration array can provide an accurate indication of not only the relative pressure across the wafer, but also the absolute pressure measured by each sensor The calibration array can remove much the potential measurement error, such as arising from the non-linearity of the sensor output versus pressure, or the balance between resistors in a bridge. Furthermore, the calibration array allows the pressure sensors to be operated at both positive and negative pressures, relative to the cavity pressure. Other dimensions may be added to the calibration array, if desired. For example, the heater in the pedestal can set various operating temperatures, thus calibrating effect of temperature on the sensor output signals can also be calibrated. Pressures corresponding to sensor output values falling between calibration points are interpolated.

Figure 8:
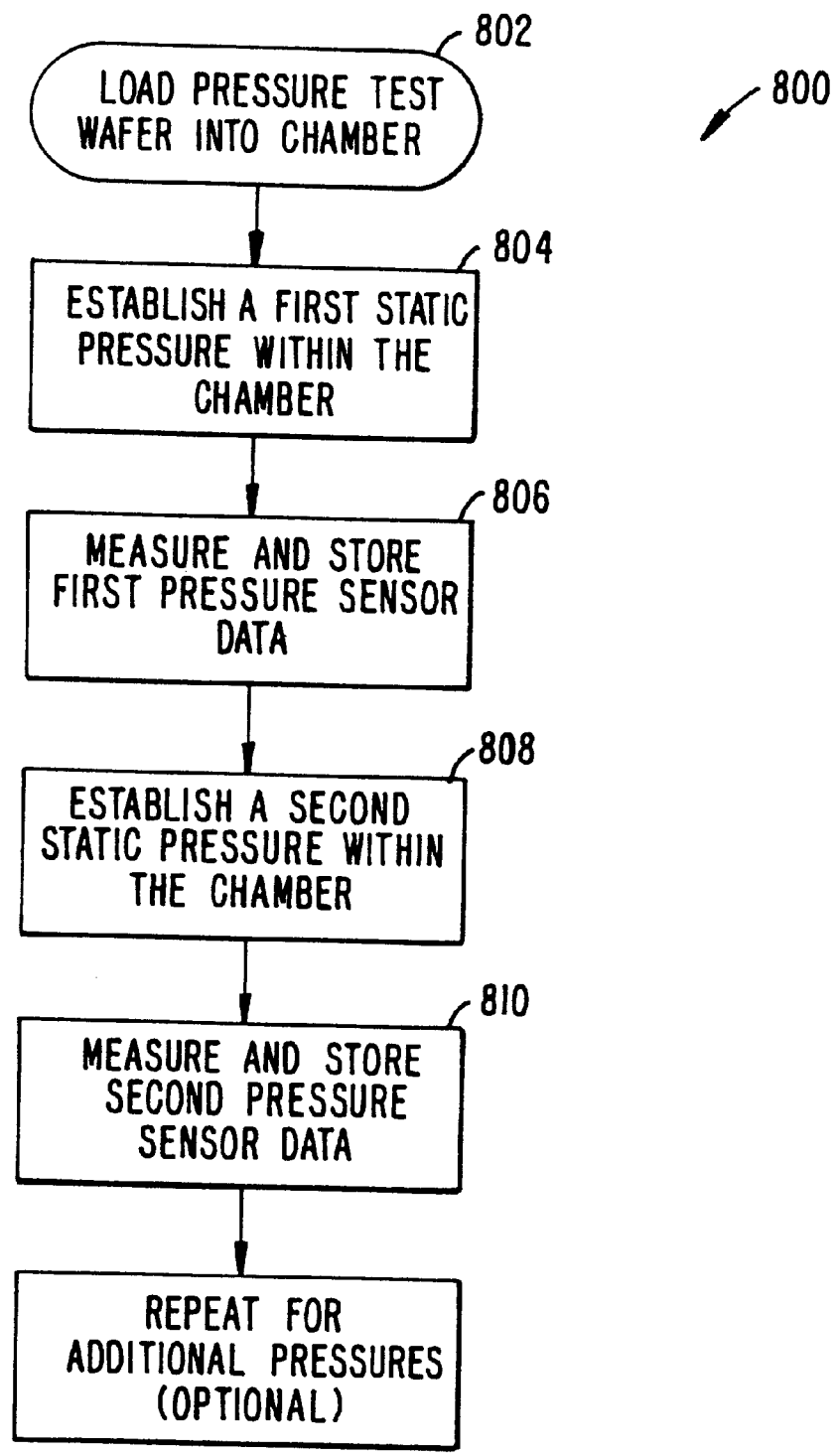
FIG. 8 is a simplified flow chart of a method for calibrating a pressure test wafer.

FIG. 8 is a simplified flow chart of a method for calibrating a pressure test wafer 800 in a processing chamber. The test wafer is loaded into the chamber (step 802) and the chamber is sealed. As discussed above, although the test wafer is loaded in the position normally occupied by a production wafer, it is not loaded in the typical manner. Rather than being loaded through an insert/removal opening in the chamber wall, the chamber is opened and the wafer is placed on the pedestal so that the test cable can be lead out of the chamber between the O-ring seal.

A first static pressure is established and maintained (step 804) in the chamber. There is no appreciable gas flow into or out of the chamber while the output signals of the pressure sensors are measured and stored (step 806). A second static pressure is established and maintained (step 808) in the chamber, and the output signals of the pressure sensors are again measured and stored (step 810). This process may be repeated many times according to the anticipated pressure measurement range, linearity of the pressure sensor outputs, and desired accuracy of the calibration and subsequent measurement.

Figure 9:
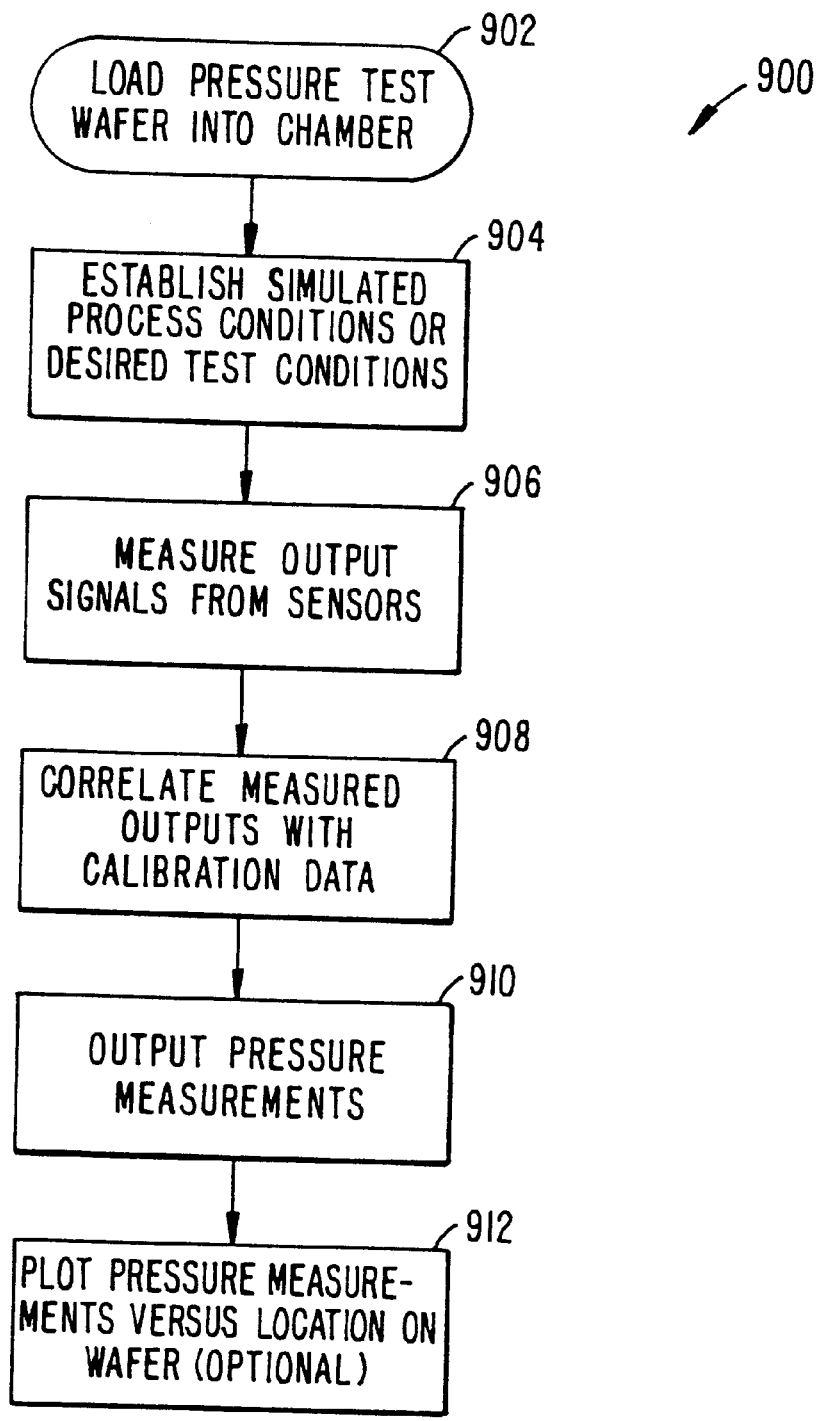
FIG. 9 is a simplified flow chart of a method for characterizing the localized dynamic pressures within a processing chamber using a pressure test wafer.

FIG. 9 is a simplified flow chart of a method for measuring the dynamic local pressures 900 within a processing chamber. The calibrated test wafer is loaded into the chamber (step 902) and the chamber is sealed. Gas input flow, exhaust rate, pedestal height, and other conditions are established and maintained according to expected processing conditions or desired test conditions (step 904). The output signals from the sensors are measured (step 906) and compared against the calibration data for the respective sensors (step 908). It is possible that a separate calibration array, as described in conjunction with FIG. 8, is not necessary, and that the uncalibrated outputs of the sensors are used to measure absolute or relative pressure. The pressures corresponding to the output signals from the sensors are determined (step 910). If desired, the pressures may be plotted according to the location on the test wafer of the pressure sensors (step 912).

While the above is a complete description of specific embodiments of the present invention, various modifications, variations, and alternatives may be employed. For example, although a particular processing chamber and gas manifold were discussed, other processing chambers and gas inlet configurations may be employed, including processing chambers with multiple deposition zones. Furthermore, application of a pressure test wafer is not limited to CVD systems, but may be applied to other processing systems, such as etch systems, including display panel etch systems. Other variations will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. An assembly for measuring pressure on a substrate comprising a reactor chamber for processing semiconductor wafers; a substrate disposed in said reactor chamber; a gas flowing into and out of said reactor chamber for assisting in producing a pressure on said substrate; and at least one pressure sensor disposed on a surface of said substrate to provide at least one electrical signal in response to the pressure on the substrate.

2. The assembly of claim 1 wherein said at least one pressure sensor comprises a plurality of pressure sensors disposed on the surface of the substrate to provide a plurality of electrical signals in response to the pressure.

3. The assembly of claim 1 wherein the substrate is a silicon wafer.

4. The assembly of claim 2 wherein the silicon wafer has a diameter of at least about 150 mm.

5. The assembly of claim 1 wherein the substrate is a printed circuit board.

6. The assembly of claim 2 wherein the substrate has at least one pocket formed in the substrate and at least one of the plurality of pressure sensors is disposed in the pocket.

7. The assembly of 3 wherein the at least one pressure sensor is fabricated on the silicon wafer to form an integrated pressure test wafer.

8. The assembly of claim 2 further comprising a plurality of conductive traces on the surface of the substrate, at least one of the plurality of conductive traces being electrically coupled to at least one of the pluality of pressure sensors.

9. The assembly of claim 8 wherein the plurality of conductive traces comprise a high-temperature conductor.

10. A The assembly of claim 9 wherein the high-temperature conductor comprises tungsten.

11. The assembly of claim 8 further comprising a ribbon cable, the ribbon cable having a plurality of wires, at least one of the plurality of wires being electrically coupled to as least one of the plurality of conductive traces.

12. The device of claim 1 wherein at least one of the plurality of sensors is a piezoresistive sensor.

13. The assembly of claim 2 wherein the substrate is a silicon wafer.

14. The assembly of claim 13 wherein the silicon wafer has a diameter of at least about 150 mm.

15. The assembly of claim 2 wherein the substrate is a printed circuit board.

16. The assembly of claim 1 wherein the substrate has at least one pocket formed in the substrate and said at least one pressure sensor is disposed in the pocket.

17. The assembly of claim 13 wherein the plurality of sensors is fabricated on the silicon wafer to form an integrated pressure test wafer.

18. The assembly of claim 1 further comprising a plurality of conductive traces on the surface of the substrate, at least one of the plurality of conductive traces being electrically coupled to said at least one pressure sensor.

19. The assembly of claim 18 wherein the plurality of conductive traces comprises a high-temperature conductor.

20. The assembly of claim 19 wherein the high-temperature conductor comprises tungsten.

21. The assembly of claim 18 further comprising a ribbon cable, the ribbon cable having a plurality of wires, at least one of the plurality of wires being electrically coupled to at least one of the plurality of conductive traces.

22. The assembly of claim 1 wherein said at least one of the pressure sensor is a piezoresistive sensor.

23. The assembly of claim 1 additionally comprising a wire coupled to said at least one pressure sensor.

24. The assembly of claim 23 wherein said wire extends out of said reactor chamber.

25. A device for measuring pressure in a chamber comprising a substrate having a substrate surface and including a structure defining a cavity; a chip pressure sensor disposed in said cavity; and at least one conductive trace disposed on said substrate surface and electrically coupled to said chip pressure sensor.

26. The device of claim 25 wherein said chip pressure sensor includes a top planar surface which is generally aligned with said substrate surface.

27. The device of claim 25 wherein said conductive trace comprises a first metal layer bound to said substrate surface and a second metal layer disposed on said first metal layer.

28. The device of claim 26 wherein said conductive trace comprises a first metal layer bound to said substrate surface and a second metal layer disposed on said first metal layer.

29. The device of claim 25 additionally comprising a reactor chamber containing said substrate.

30. The device of claim 28 additionally comprising a reactor chamber containing said substrate.

31. The device of claim 29 additionally comprising a gas flowing through said reactor chamber and contacting said substrate.

32. The device of claim 30 additionally comprising a gas flowing through said reactor chamber and contacting said substrate.

33. The device of claim 25 wherein said substrate comprises a temperature above about 150° C.

34. The device of claim 32 wherein said substrate comprises a temperature above about 150° C.

35. The device of claim 25 wherein said substrate comprises a temperature above about 450° C.

36. The device of claim 27 wherein said substrate comprises a temperature above about 450° C.

37. The device of claim 1 wherein said substrate comprises a temperature above about 150° C.

38. The device of claim 2 wherein said substrate comprises a temperature above about 450° C.

39. An integrated test wafer for measuring pressure in a processing chamber comprising a substrate having a substrate surface and including a substrate structure with no flexible diaphragm; a plurality of pressure sensors integrally formed in said substrate and in proximity to said substrate surface such as to be exposed for measuring pressure in a reactor chamber; and a conductive trace disposed on said substrate surface.

40. The integrated test wafer of claim 39 wherein said pressure sensors include at least one high-temperature metallization layer.

41. The integrated test wafer of claim 39 wherein each of said pressure sensors include a thin-film resistor coupled to said conductive trace.

42. The integrated test wafer of claim 40 wherein each of said pressure sensors include a thin-film resistor coupled to said conductive trace.

43. The integrated test wafer of claim 39 wherein said silicon substrate comprises a temperature above about 150° C.

44. The integrated test wafer of claim 42 wherein said silicon substrate comprises a temperature above about 450° C.

45. The integrated test wafer of claim 34 wherein said silicon substrate comprises a defect density greater than about $0.15/cm^2 > 0.2 \mu$.

46. Device for measuring pressure in a chamber comprising a substrate having a substrate surface and a structure defining a cavity; a first diaphragm layer supported by said substrate layer and extending over said cavity; a second diaphragm layer supported by said first diaphragm layer; at least one thin-film resistor supported by said second diaphragm layer; and at least one conductive trace supported by said substrate surface and coupled to said at least one thin-film resistor.

47. The device of claim 46 wherein said substrate comprises said structure additionally having a ledge.

48. The device of claim 46 additionally comprising a dielectric layer supported by said second diaphragm layer and disposed between said thin-film resistor and said second diaphragm layer.

49. The device of claim 47 additionally comprising a dielectric layer supported by said second diaphragm layer and disposed between said thin-film resistor and said second diaphragm layer.

50. The device of claim 47 wherein said first diaphragm layer has an opening wherethrough a portion of the second diaphragm layer extends for contacting and being supported by said ledge.

51. The device of claim 49 wherein said first diaphragm layer has an opening wherethrough a portion of the second diaphragm layer extends for contacting and being supported by said ledge.

52. The device of claim 46 additionally comprising a barrier layer supported by said second diaphragm layer.

53. The device of claim 52 wherein said at least one thin-film resistor comprises four interconnected thin-film resistors forming four corners, and said at least one conductive trace comprises four conductive traces coupled to said four interconnected thin-film in resistors at said four corners.

* * * * *